(12) United States Patent
Yokosho (10) Patent No.: US 11,025,244 B2
(45) Date of Patent: Jun. 1, 2021

(54) SWITCH DRIVING CIRCUIT AND DRIVING APPARATUS

(71) Applicant: DENSO CORPORATION, Kariya (JP)

(72) Inventor: Tatsuya Yokosho, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/988,008

(22) Filed: Aug. 7, 2020

(65) Prior Publication Data
US 2021/0044287 A1 Feb. 11, 2021

(30) Foreign Application Priority Data

Aug. 8, 2019 (JP) .............................. JP2019-146586

(51) Int. Cl.
| H03K 17/08 | (2006.01) |
| H03K 17/68 | (2006.01) |
| H02M 1/32 | (2007.01) |
| H03K 17/082 | (2006.01) |
| H02M 1/088 | (2006.01) |
| H03K 17/042 | (2006.01) |

(52) U.S. Cl.
CPC ........ *H03K 17/0822* (2013.01); *H02M 1/088* (2013.01); *H03K 17/04206* (2013.01)

(58) Field of Classification Search
CPC .. H03K 17/08; H03K 17/082; H03K 17/0812; H03K 17/0814; H03K 17/16; H03K 17/165; H03K 17/18; H03K 17/68; H03K 17/04; H03K 17/042; H03K 17/0416; H01M 1/32; H01M 1/088; H01M 1/096; G05F 1/565; G05F 1/569; G05F 1/571; G05F 1/573
See application file for complete search history.

(56) References Cited

U.S. PATENT DOCUMENTS

| 7,848,073 B2 * | 12/2010 | Takahashi | .............. H03K 17/18 |
| | | | 361/93.2 |
| 8,497,728 B2 * | 7/2013 | Mizobe | .............. H03K 17/0828 |
| | | | 327/427 |
| 2007/0187217 A1 | 8/2007 | Tai | |

* cited by examiner

*Primary Examiner* — An T Luu
(74) *Attorney, Agent, or Firm* — Oliff PLC (57) ABSTRACT

A switch driving circuit that drives a switch is provided. The switch driving circuit includes: a surge detecting unit that detects a surge voltage caused by switching of a state of the switch; a speed setting unit that sets, based on the surge voltage detected by the surge detecting unit, a switching speed of the switch when the state of the switch is switched; and a fault determination unit that determines whether a fault has occurred on the surge detecting unit. The speed setting unit is configured to change a setting of the switching speed to a fault setting when the fault determination unit determines that a fault has occurred on the surge detecting unit, from a normal setting in a state where the fault determination unit determines that no fault has occurred on the surge detecting unit, while maintaining driving of the switch.

7 Claims, 9 Drawing Sheets

SWITCH DRIVING CIRCUIT AND DRIVING APPARATUS

CROSS-REFERENCE TO RELATED APPLICATION

This application is based on and claims the benefit of priority from earlier Japanese Patent Application No. 2019-146586 filed Aug. 8, 2019, the description of which is incorporated herein by reference.

BACKGROUND

Technical Field

The present disclosure relates to a switch driving circuit and a driving apparatus.

Description of the Related Art

A switch driving circuit capable of reducing surge voltage caused by a switch changing to an OFF state is known. In such a switch driving circuit, a voltage detection section, a current source and a current adjusting section are provided.

SUMMARY

The present disclosure provides a switch driving circuit (DrH, DrL) that drives a switch (SWH, SWL) including: a surge detecting unit (60) that detects a surge voltage caused by switching of a state of the switch; a speed setting unit that sets, based on the surge voltage detected by the surge detecting unit, a switching speed of the switch when the state of the switch is switched; and a fault determination unit that determines whether a fault has occurred on the surge detecting unit. The speed setting unit is configured to change a setting of the switching speed to a fault setting when the fault determination unit determines that a fault has occurred on the surge detecting unit, from a normal setting in a state where the fault determination unit determines that no fault has occurred on the surge detecting unit, while maintaining driving of the switch.

DESCRIPTION OF THE PREFERRED EMBODIMENTS

As a conventional switching drive circuit, for example, Japanese Patent Application Laid-Open Publication No. 2007-221863 discloses a switch driving circuit including a main voltage detecting section that detects voltage applied between main electrodes of the switch, a current source that injects current to the gate of the switch based on the voltage detected by the main voltage detecting section and an adjusting section that adjusts an amount of current of the current source based on the current flowing between the main electrodes of the switch, whereby surge voltage caused by the switch changing to the OFF state is reduced. Moreover, as a driving circuit that reduces surge voltage, for example, a surge voltage detecting section that detects surge voltage caused by the switch changing to the OFF state, a speed setting section that sets the switching speed of the switch when switching the state of the switch based on the detected surge voltage are provided. In this driving circuit, a fault possibly occurs in the surge voltage detecting section. In this case, driving of the switch to be ON and OFF may be stopped. However, in this case, chances of driving the switch is restricted.

First Embodiment

Hereinafter, with reference to the drawings, a first embodiment in which a driving circuit according to the present disclosure is embodied will be described.

Figure 1:
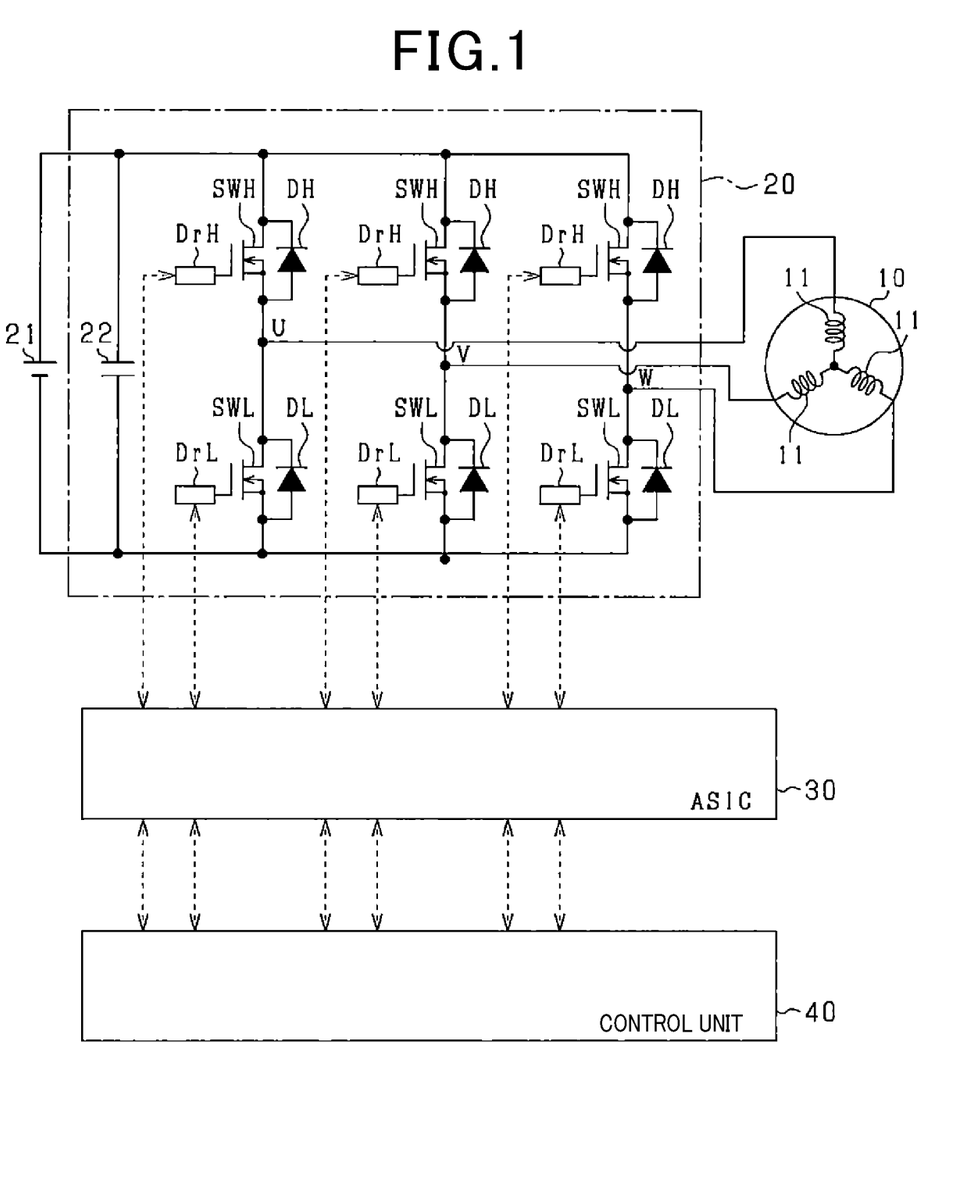
FIG. 1 is a diagram showing an overall configuration of a control system of a rotary electric machine according to a first embodiment of the present disclosure.

As shown in FIG. 1, a control system is provided with a rotary electric machine 10, an inverter 20, an integrated circuit 30 and a control unit 40 of which the control object is the rotary electric machine. According to the present embodiment, the control system is mounted on a vehicle. According to the present embodiment, the rotary electric machine 10 includes three-phase windings which are star-connected. The rotor of the rotary electric machine 10 is provided to be capable of readily transmitting a force to the driving wheels of the vehicle. The rotary electric machine 10 is configured as a synchronous machine, for example.

The rotary electric machine 10 is connected to a DC power source 21 via the inverter 20. According to the present embodiment, the DC power source 21 is a storage battery. Note that a smoothing capacitor 22 is provided between the DC power source 21 and the inverter 20.

The inverter 20 is provided with a series-connected circuit composed of an upper arm switch SWH and a lower arm switch SWL for respective phases U, V, W. According to the present embodiment, as the respective switches SWH and SWL, N-channel MOSFET configured as a unipolar device and made of silicon carbide (SiC). The upper arm switch SWH includes an upper arm diode DH as a body diode. The lower arm switch SWL includes a lower arm diode DL as a body diode.

In each phase, a first end of the wiring 11 of the rotary electric machine 10 is connected to a connection point between the source of the upper arm switch SWH and the drain of the lower arm switch SWL. The second end of the wiring 11 of the respective phases are connected at a neutral point.

The control unit 40 controls the inverter 20 such that a control amount of the rotary electric machine 10 is controlled to be the command value. The control amount is a torque, for example. The control unit 40 outputs upper/lower arm drive signals SGH and SGH to the integrated circuit 30 so as to control the lower arm switch SWH and the upper arm switch SWL to be alternately ON with a dead time therebetween. Each of the drive signals serves as either an ON command that commands the switch to turn ON and an OFF command that commands the switch to turn OFF. According to the present embodiment, the control unit 40 corresponds to a signal generation unit.

The integrated circuit 30 is configured as ASIC (application specific integrated circuit). The integrated circuit 30 receives the upper/lower arm drive signals SGH and SGL and outputs them to the upper/lower arm driving circuit s DrH and DrL provided for respective upper/lower arm switches SWH and SWL. Note that functions provided by the upper/lower arm driving circuit s DrH and DrL can be accomplished by software stored in a non-transitory tangible recording media such as a memory device, a computer or a hardware that executes the software, or a combination thereof.

Figure 2:
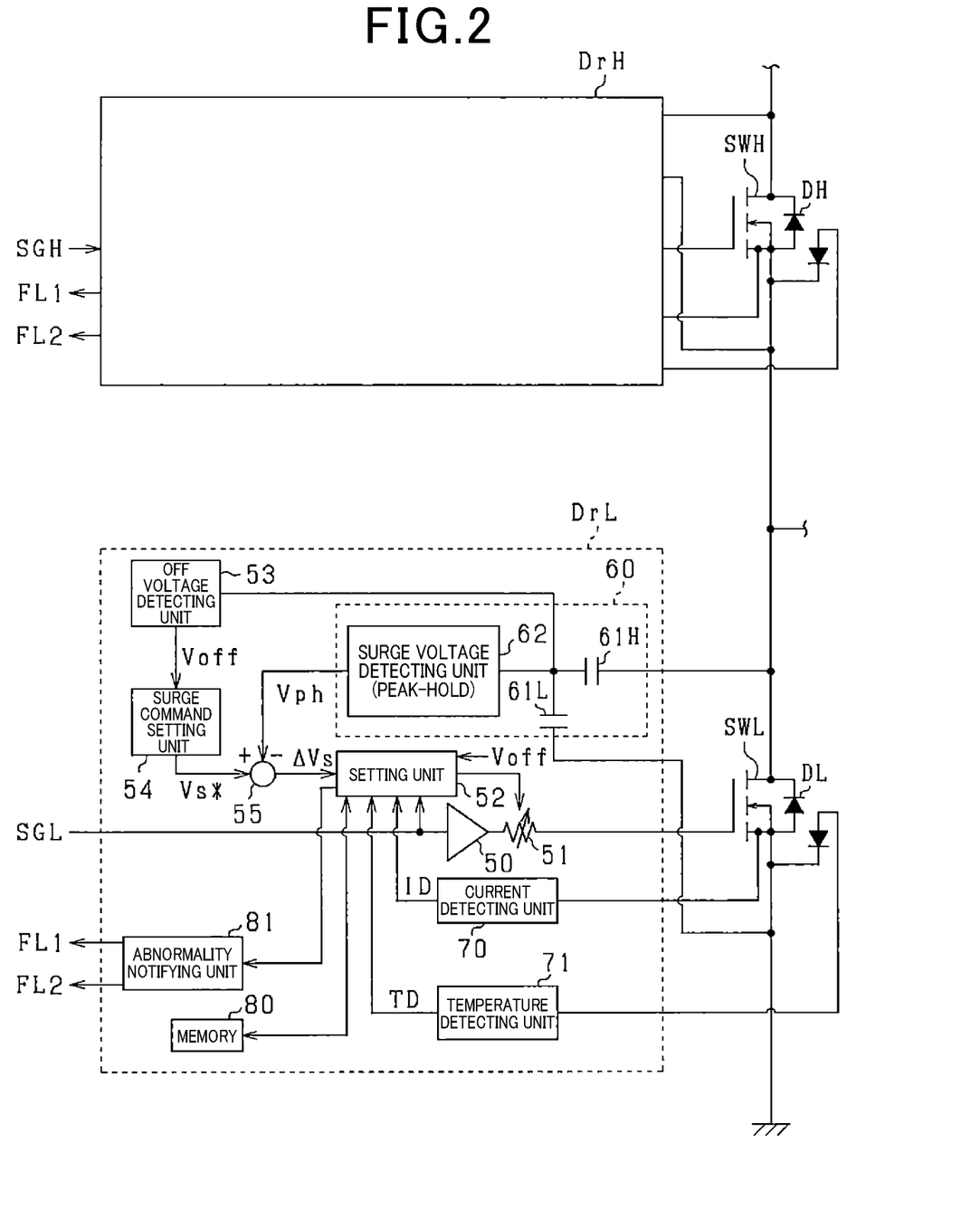
FIG. 2 is a diagram showing a configuration of a driving circuit.

Subsequently, with reference to FIG. 2, a driving circuit will be described. According to the present embodiment, the upper arm driving circuit DrH and the lower arm driving circuit DrL are substantially the same configuration. Hence, as an example, the lower arm driving circuit DrL will be described in the followings.

The lower arm driving circuit DrL includes a buffer 50 and a gate resistor 51. The gate resistor 51 is configured to have variable resistance. The buffer 50 acquires the lower arm drive signal SGL from the integrated circuit 30, and supplies a charge current to the fate of the lower arm switch SWL via the gate resistor 51 when the acquired drive signal SGL indicates the ON command. Thus, the gate voltage of the lower arm switch SWL (i.e. voltage difference between the source and the drain, that is, voltage potential at the drain relative to the source) becomes larger than or equal to the threshold voltage Vth, and the lower arm switch turns ON. On the other hand, the buffer circuit 50 causes the discharge current to flow from the gate of the lower arm switch SWL via the gate resistor 51, when the acquired drive signal SGL indicates the OFF command. Thus, the gate voltage of the lower arm switch SWL becomes less than the threshold voltage Vth, and the lower arm switch SWL turns OFF.

The lower arm driving circuit DrL includes a setting unit 52, an OFF voltage detecting unit 53, a surge command calculating unit 54, a deviation calculating unit 55 and a surge detecting unit 60. The surge detecting unit 60 includes a plurality of capacitors connected in series. The series-connected capacitors are connected in parallel to the lower arm switch SWL. The series-connected capacitors are divided into two capacitors such as a low voltage capacitor 61L positioned at lower voltage side and a high voltage capacitor 61H positioned at high voltage side. FIG. 2 exemplifies that each of the low voltage capacitor and the high voltage capacitor is configured as a single capacitor. However, it is not limited to this configuration, but each of the low voltage capacitor and the high voltage capacitor may be configured of two or more capacitors. The source-drain voltage of the lower arm switch SWL is divided by a plurality of capacitors, whereby high voltage surge voltage can be detected while application voltage of each capacitor is set to be lower than or equal to the allowable maximum rating. Note that capacitance of each capacitor in the present embodiment is the same.

The surge detecting unit 60 includes a surge voltage detecting unit 62. The surge voltage detecting unit 62 includes a peak hold circuit configured to detect a peak value of a voltage between terminals of the low voltage capacitor 61L caused by turning OFF of the lower arm switch SWL, as a surge voltage Vph (peak value between source drain voltage) caused by turning OFF of the lower arm switch SWL. Note that the detected surge voltage Vph will be reset before next OFF command as the lower arm drive signal SGL is inputted to the lower arm driving circuit DrL.

The off voltage detecting unit 53 detects an OFF voltage Voff which is a terminal voltage of the low voltage capacitor 61L when the lower arm switch SWL is the OFF state.

The surge command calculation unit 54 calculates a surge command value Vs* based on the detected OFF voltage Voff. The surge command value Vs* is set to be a value higher than the power supply voltage VHr and lower than or equal to the allowable maximum rating of the source-drain voltage of the lower arm switch SWL.

The deviation calculating unit 55 calculates a voltage deviation $\Delta Vs$ (i.e. Vs*−Vph) by subtracting the surge voltage Vph detected in the current switching period from the surge command value Vs*.

The lower arm driving circuit DrL includes a current detecting unit 70 and the temperature detecting unit 71. The current detecting unit 70 detects a drain current flowing through the lower arm switch SWL as a switch current ID. The temperature detecting unit 71 detects the temperature of the lower arm switch SWL as a switch temperature TD. The detection values of the current detecting unit 70, the temperature detecting unit 71 and the OFF voltage detecting unit 53 are transmitted to the setting unit 52.

The setting unit 52 performs, based on the voltage deviation $\Delta Vs$, the switch current ID, the switch temperature TD, the OFF voltage Voff and the map information, a surge feedback control in which resistance Roff of the gate resistor 51 is set when switching the lower arm switch SWL to be OFF state in the next switching period. Thus, the detected surge voltage Vph is feedback-controlled to be the surge command value Vs*. The map information is stored in the memory 80 as a memory unit included in the lower arm driving circuit DrL. The memory 80 is configured as a non-transitory substantial recording media (e.g. non-volatile memory other than ROM).

Figure 3:
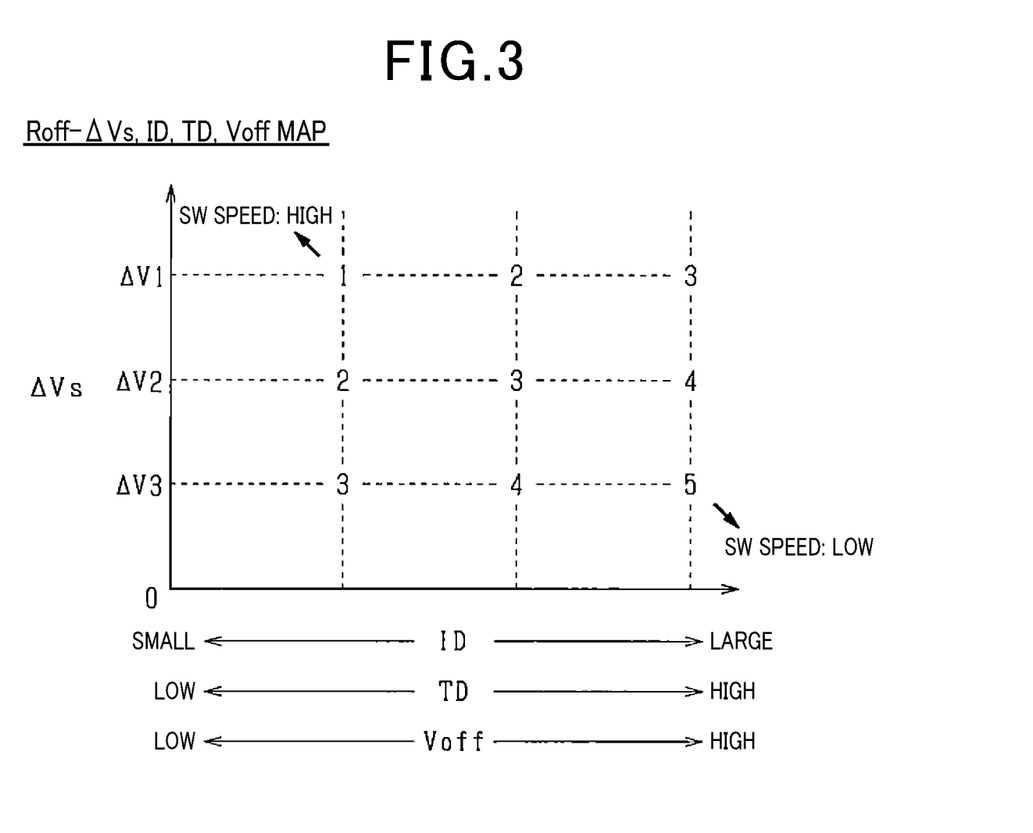
FIG. 3 is a diagram showing an outline of map information of gate resistance.

The map information includes resistance Roff correlated with the voltage deviation $\Delta Vs$, the switch current ID, the switch temperature TD and the Off voltage Voff. As shown in FIG. 3, the resistance Roff is determined to be correlated with combinations of a plurality of voltage deviations $\Delta Vs$, a plurality of switch current ID, a plurality of switch temperature TD and a plurality of OFF voltage Voff. In FIG. 3, as a plurality of voltage deviations $\Delta Vs$, three voltage deviations $\Delta V1$, $\Delta V2$ and $\Delta V3$ are exemplified. However, it is not limited to these voltage deviations.

In the map information, the resistance Roff is set such that the larger the voltage deviation $\Delta Vs$, the smaller the resistance Roff is. Further, the resistance Roff is set to be larger as the switch current ID is higher, the switch temperature TD is higher, and the OFF voltage Voff is larger. The switching speed becomes lower as the resistance Roff becomes larger.

According to the present embodiment, the setting unit 52, the OFF voltage detecting unit 53, the surge command calculating unit 54 and the deviation calculation unit 55 correspond to a speed setting unit.

Figure 4:
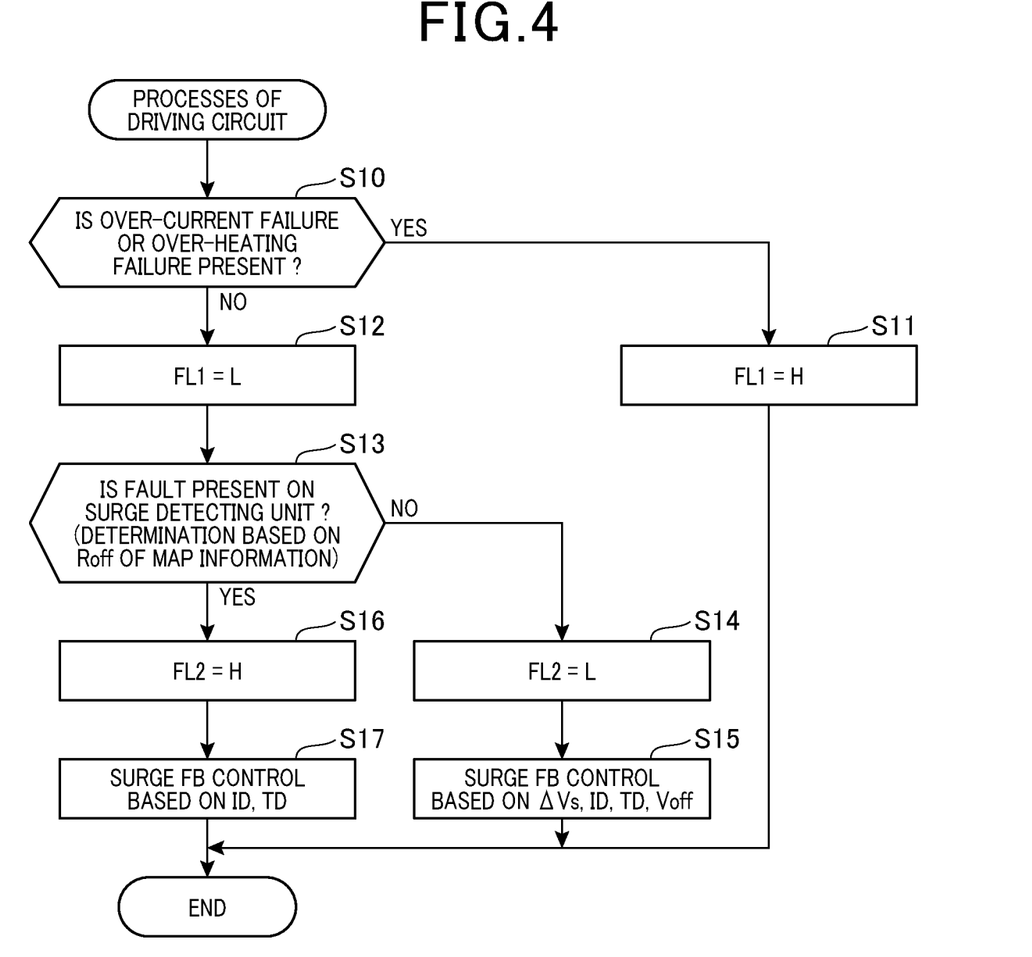
FIG. 4 is a flowchart showing processes executed by the driving circuit.

The setting unit 52 executes processes shown in FIG. 4. These processes are executed taking a case where fault possibly occur on the respective capacitors 61H, 61L, the surge detecting voltage detecting unit 62, and the surge detecting unit 60 into consideration.

That is, an open fault on the high voltage capacitor 61H or a short fault on the low voltage capacitor 61L possibly occur. In this case, the surge voltage Vph detected by the surge voltage detecting unit 60 becomes lower than the actual surge voltage. As a result, the resistance of the gate resistor 51 set by the setting unit 52 becomes lower than an appropriate resistance for performing a feedback control of the surge voltage Vph to be the surge command value Vs*, and the actual switching speed becomes higher than an appropriate switching speed. Thus, surge voltage produced when the lower arm switch SWL turns to the OFF state exceeds the allowable maximum rating, thereby possibly causing a fault of the lower arm switch SWL. In this respect, processes shown in FIG. 4 are executed. For example, these processes are repeatedly executed at predetermined periods.

At step S10, the process determines whether an over-current failure of the lower arm switch SWL or an over-heat failure of the lower arm switch SWL has occurred. For example, when determining that the switch current ID exceeds the over-current threshold, the process may determine that an over-current failure has occurred. Further, when determining that the switch temperature TD exceeds the over-current threshold, the process may determine that an over-heat failure has occurred.

When the process determines that an over-current failure or an over-heat failure has occurred at step S10, the process proceeds to step S11 and commands an abnormality notifying unit 81 included in the lower arm driving circuit DrL to change a state of the first failure signal FL1 to be High. The first failure signal FL1 outputted by the abnormality notifying unit 81 is transmitted to the integrated circuit 30.

When the process determines that neither over-current failure nor over-heat failure has occurred at step S10, the process proceeds to step S12 and commands the abnormality notifying unit 81 to change the state of the first failure command FL1 to be Low.

At step S13, the process determines whether a fault has occurred in the surge detecting unit 60. According to the present embodiment, when the process determines that the resistance Roff (t) set at the current switching period is shifted from the resistance Roff (t−1) set at the previous switching period for a value exceeding a threshold ST, the process determines that a fault has occurred in the surge detecting unit 60. This determination method is a method taking a case where the resistance Roff is not significantly changed during such a short period from the previous switching period to the current switching period into consideration. Note that the resistance Roff (t) in the current switching period which are used at step S13 is set in accordance with the above-described method using the voltage deviation ΔVs, the switch current ID, the switch temperature TD, the OFF voltage Voff and the map information.

When the process determines that no fault has occurred in the surge detecting unit 60 at step S13, the process proceeds to step S14 and commands the abnormality notifying unit 81 to change the state of the second failure signal FL2 to be Low. The second failure signal FL2 outputted by the abnormality notifying unit 81. The second failure signal FL2 outputted by the abnormality notifying unit 81 is transmitted to the control unit 40 via the integrated circuit 30.

At step S15, the process performs, based on the voltage deviation ΔVs, the switch current ID, the switch temperature TD, the OFF voltage Voff and the map information, a surge feedback control to set the resistance Roff of the gate resistor 51 in the case where the state of the lower arm switch SWL is changed to OFF in the next switching period. The process at step S15 corresponds to normal setting.

On the other hand, at step S13, when the process determines that a fault has occurred on the surge detecting unit 60, the process proceeds to step S16 and commands the abnormality notifying unit 81 to change the state of the second failure signal FL2 to be High.

At step S17, the process performs, based on the switch current ID, the switch temperature TD and the map information without using the voltage deviation ΔVs and the OFF voltage Voff, a surge feedback control to set the resistance Roff of the gate resistor 51 in the case where the state of the lower arm switch SWL is changed to OFF in the next switching period.

In the process at step S17, the switching speed when determining that a fault has occurred on the surge detecting unit 60 is lowered compared to the switching speed when determining that no fault has occurred, for a switch current ID and a switch temperature TD. Here, the switching speed is lowered, but the setting of the resistance Roff based on the switch current ID and the switch temperature TD is maintained. Hence, reduction of the switching loss can be maintained as much as possible while suppressing surge voltage. The process at step S17 corresponds to fault setting.

Note that the map information used for setting the resistance Roff at step S17 refers to map information that determines resistance Roff correlated with the switch current ID and the switch current TD, which is different from the map information used at step S15.

Note that the processes shown in FIG. 4 are executed by the setting unit 52 of the upper arm switch DrH.

Figure 5:
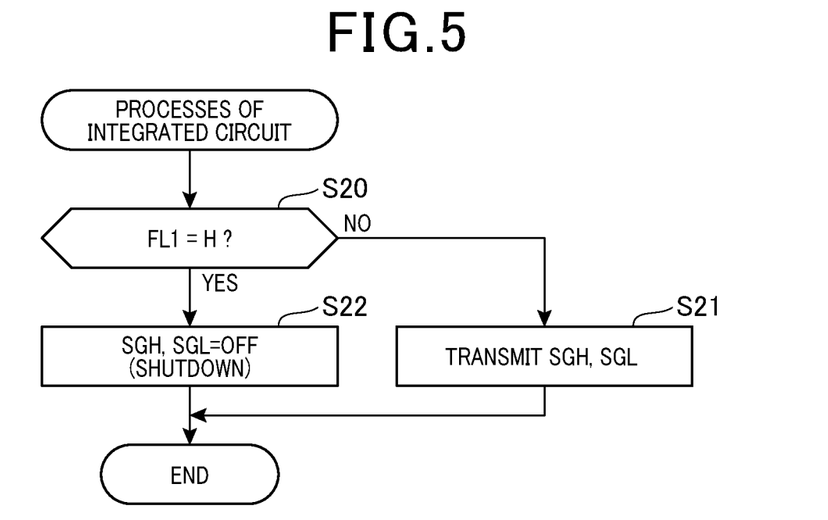
FIG. 5 is a flowchart showing processes executed by an integrated circuit.

Subsequently, processes executed by the integrated circuit 30 is shown in FIG. 5. For example, these processes are repeatedly executed at predetermined periods. Note that the control periods may be the same as the control periods of the setting unit 52 or may be different periods.

At step S20, the process determines whether the state of the received first failure signal FL1 is High or not.

When determining that the state is Low at step S20, the process determines that no over-current failure nor no over-heat failure has occurred, and proceeds to step S21. At step S21, the integrated circuit 30 outputs the upper arm drive signal SGH and the lower arm drive signal SGL transmitted from the control unit 40 directly to the upper arm driving circuit DrH and the lower arm driving circuit DrL.

On the other hand, when determining that the state is High at step S20, the process determines that an over-current failure or an over-heat failure has occurred, and proceeds to step S22. At step S22, the integrated circuit 30 outputs the upper and lower arm drive signals SGH and SGL indicating OFF commands to the upper and lower arm driving circuits DrH and DrL, regardless of the upper and lower arm drive signals SGH and SGL from the control unit 40. Thus, the upper and lower arm switches SWH and SWL in each phase are all turned OFF.

Figure 6:
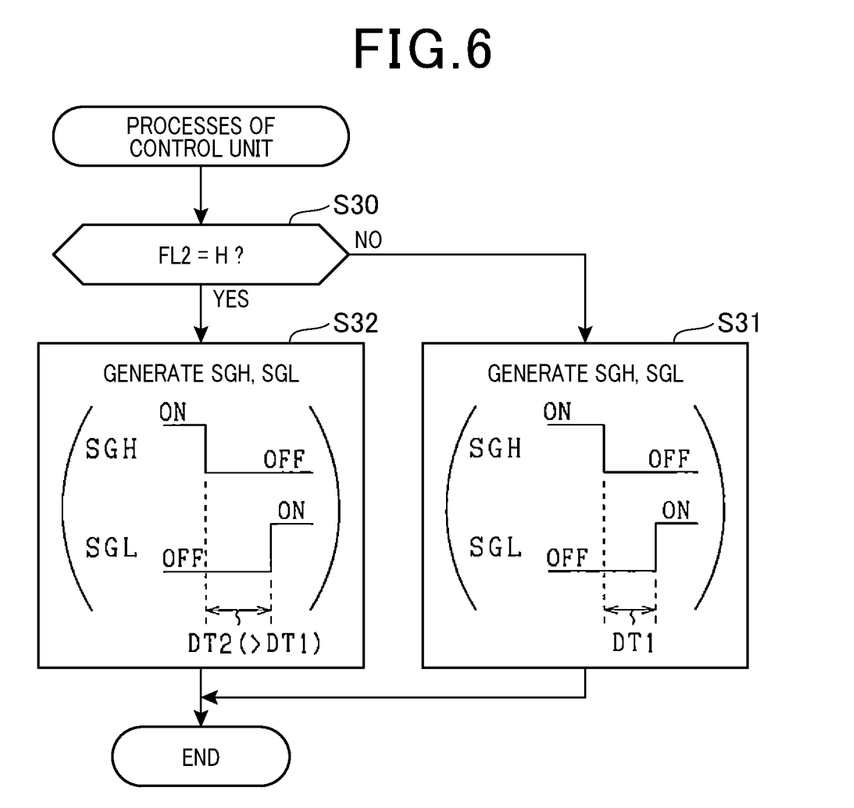
FIG. 6 is a flowchart showing processes executed by a control unit.

FIG. 6 shows processes executed by the control unit 40. For example, these processes are repeatedly executed at predetermined periods. Note that the control periods may be the same as the control periods of the setting unit 52 and the integrated circuit 30 or may be different periods.

At step S30, the process determines whether the state of the received second failure signal FL2 is High or not.

When determining that the state is Low at step S30, the process determines that a fault has not occurred on the surge detecting unit 60 and proceeds to step S31. At step S31, a first dead time D1 is applied between a switching timing in response to the OFF command of one drive signal in the upper arm drive signal SGH and the lower arm drive signal SGL, and a switching timing in response to the ON command of the other drive signal in the upper arm drive signal SGH and the lower arm drive signal SGL.

On the other hand, when determining the state is High at S30, the process determines that a fault has occurred on the surge detecting unit 60 and proceeds to step S32. At step S32, a second dead time D2 which is larger than the first dead time DT1 is applied between a switching timing in response to the OFF command of one drive signal in the upper arm drive signal SGH and the lower arm drive signal SGL, and a switching timing in response to the ON command of the other drive signal in the upper arm drive signal SGH and the lower arm drive signal SGL. Thus, even when the switching speed is lowered at step S19 shown in FIG. 10, the upper and lower arm switches SWH and SWL in the same phase can be prevented from being simultaneously turned ON.

In the above-described embodiments, when determining that a fault has occurred on the surge detecting unit 60, the switching speed is set to be lower than a case where no fault has occurred on the surge detecting unit 60. Thus, the switching speed can be set to be on the safer side even in the case where the surge voltage detected by the surge detecting unit 60 is significantly shifted from the actual surge voltage. As a result, ON-OFF driving of the switches can be continued, and evacuation traveling of the vehicle can be appropriately performed.

Modifications of the First Embodiment

At step S17 shown in FIG. 4, the resistance of the gate resistor 51 may be set to the maximum value among available values of the resistance Roff for the gate resistor 51.

At step S13 shown in FIG. 4, in the case where an absolute value of a difference between the surge voltage Vph (t) detected in the current switching period and the surge voltage Vph (t−1) detected in the previous period exceeds a predetermined amount ΔVt, the process may determine that a fault has occurred in the surge detecting unit 60. This determination method is applied considering a case where the surge voltage Vph significantly varies depending on whether a fault has occurred in a capacitor that constitutes the surge detecting unit 60 or not.

Figure 7:
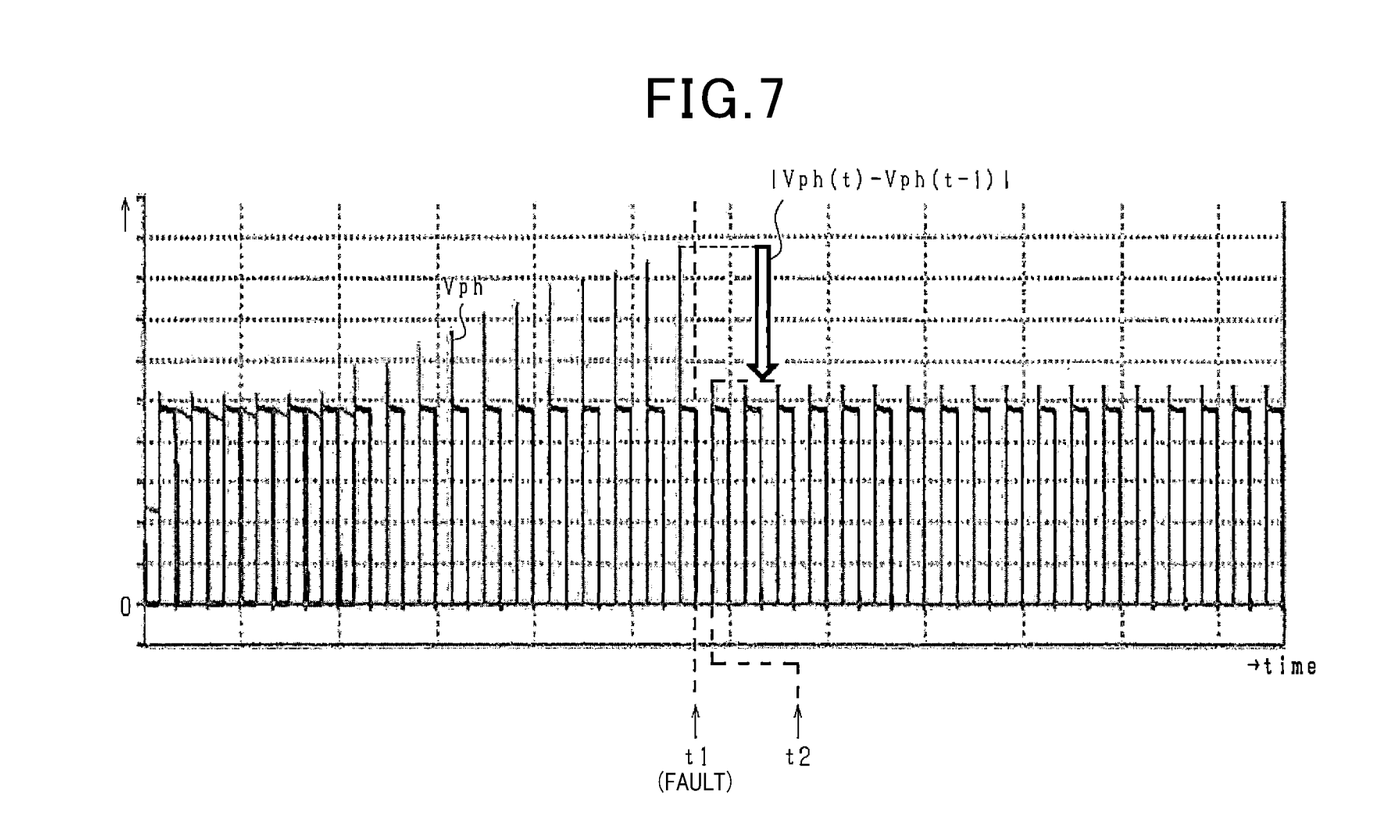
FIG. 7 is a timing diagram showing a change in the voltage between the source and the drain in the case where a short failure of a low voltage capacitor or an open failure of a high voltage capacitor occurs according to a modification of the first embodiment.

FIG. 7 shows a change in the terminal voltage of the low voltage capacitor 61L. In FIG. 7, at time t1, an open fault of the high voltage capacitor 61H or a short fault of the low voltage capacitor 61L occurs. In this case, the surge voltage Vph detected at time t2 is significantly lowered. Considering this point, the above-described determination method is defined.

Figure 8:
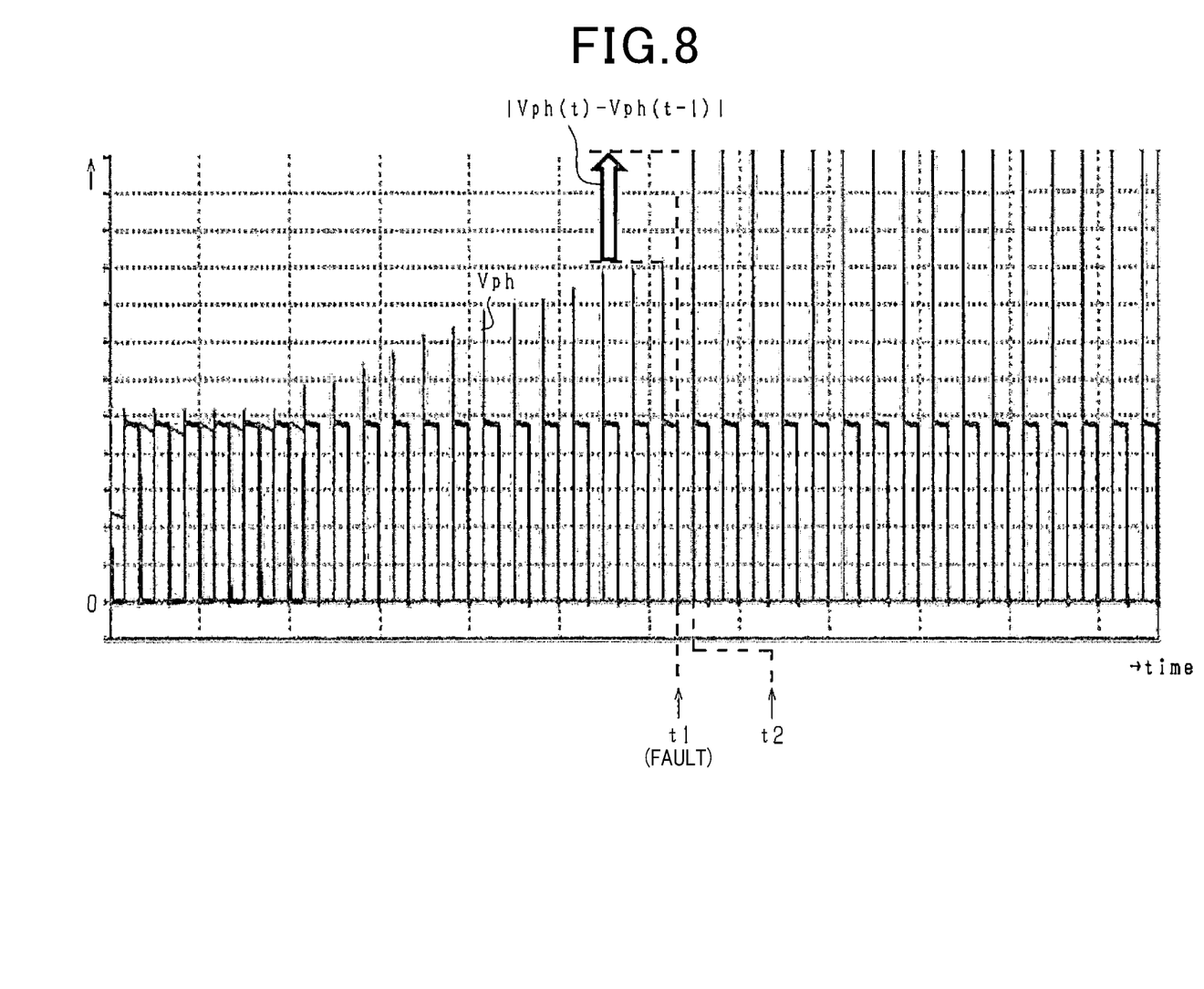
FIG. 8 is a timing diagram showing a change in the voltage between the source and the drain in the case where an open failure of a low voltage capacitor or a short failure of a high voltage capacitor occurs according to a modification of the first embodiment.

In the case where a short fault has occurred on the high voltage capacitor 61H or an open fault has occurred on a low voltage capacitor 61L, detected surge voltage also significantly varies. In FIG. 8, a short fault occurs on the high voltage capacitor 61H or an open fault occurs on the low voltage capacitor 61L at time t1. In this case, the surge voltage Vph detected at time t2 significantly increases.

At step S13 shown in FIG. 4, when determining that the surge voltage Vph (t−1) detected at previous switching period and the voltage Vph (t) detected at current switching period are the same, the process may determine that a fault has occurred on the surge detecting unit 60. This determination method is a method considering a case in which when an open fault on the high voltage capacitor 61H or a short fault on the low voltage capacitor 61L occurs, the produced surge voltage Vph will not change anymore after the time t2 shown in FIG. 7. Even in a case where a short fault on the high voltage capacitor 61H or an open fault on the low voltage capacitor 61L occurs, the produced surge voltage Vph will not change anymore after the time t2 shown in FIG. 8.

Second Embodiment

Figure 9:
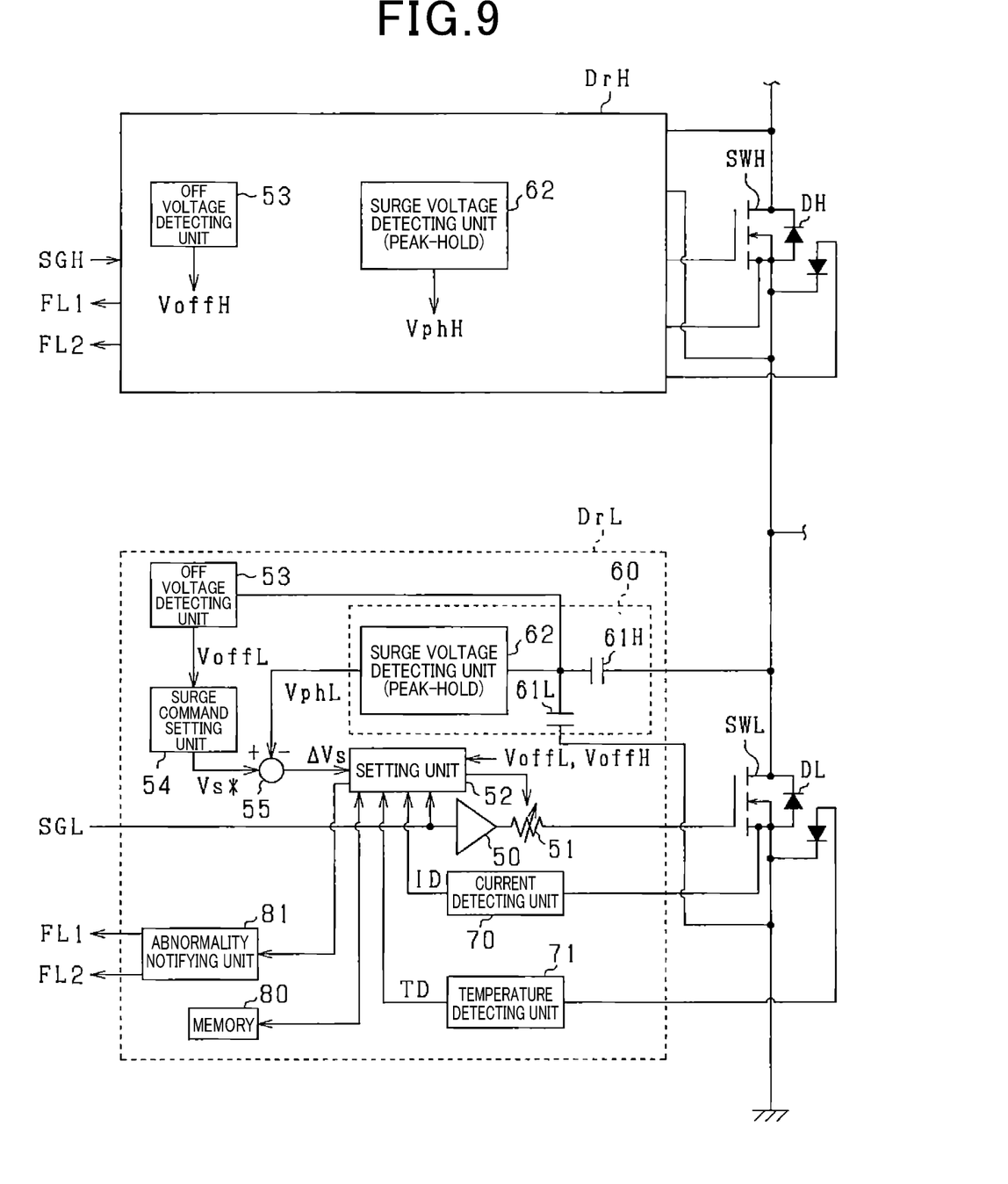
FIG. 9 is a diagram showing a configuration of a driving circuit according to a second embodiment.

Hereinafter, with reference to the drawings, a second embodiment will be described. In the second embodiment, configurations different from those in the first embodiment will be mainly described. According to the second embodiment, a process executed when determined that a fault has occurred on the surge detecting unit 60 is changed. According to the present embodiment, as shown in FIG. 9, the OFF voltage detected by the OFF voltage detecting unit 53 of the lower arm driving circuit DrL is referred to as a lower arm OFF voltage VoffL and the OFF voltage detected by the OFF voltage detecting unit 53 of the upper arm driving circuit DrH is referred to as an upper arm OFF voltage VoffH. The surge voltage detected by the surge voltage detecting unit 62 of the lower arm driving circuit DrL is referred to as a lower arm surge voltage VphL and the surge voltage detected by the surge voltage detecting unit 62 of the upper arm driving circuit DrH is referred to as an upper arm surge voltage VphH.

Hereinafter, the lower arm driving circuit DrL will be described. The lower arm switch SWL corresponds to own arm switch, and the upper arm switch SWH corresponds to opposed arm switch. Further, the surge detecting unit 60 of the lower arm driving circuit DrL corresponds to lower arm detecting unit and own arm detecting unit, and the surge detecting unit 60 of the upper arm driving circuit DrH corresponds to upper arm detecting unit and opposed arm detecting unit.

Figure 10:
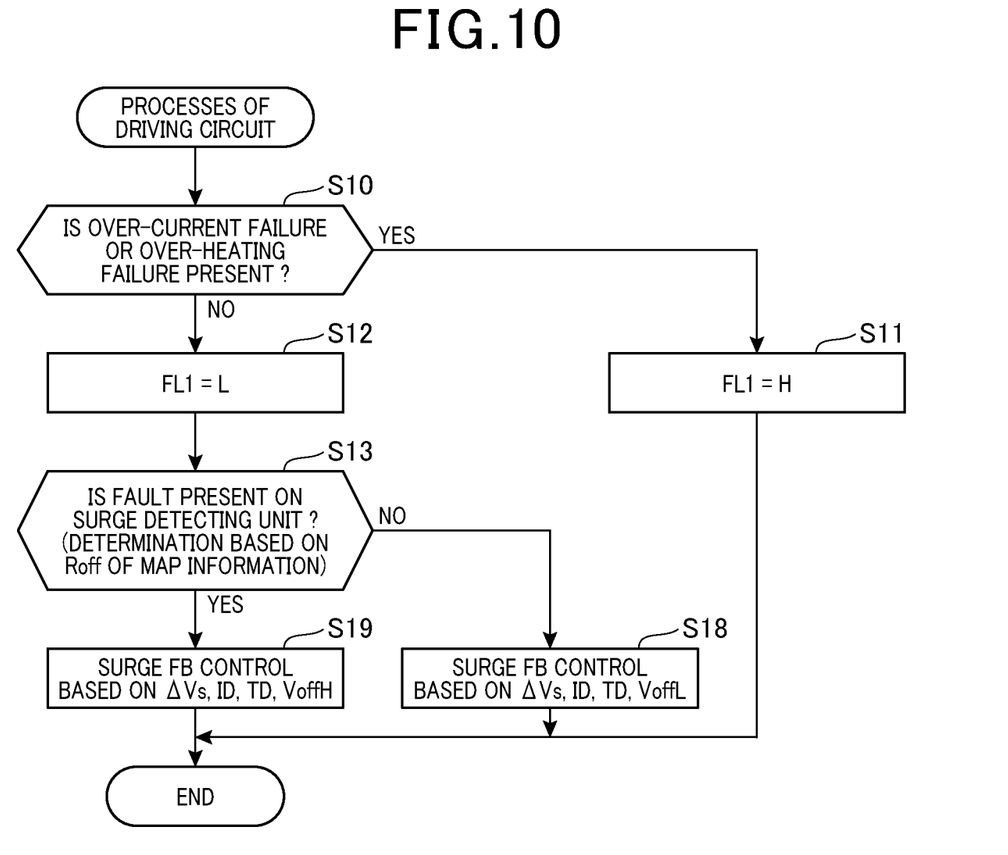
FIG. 10 is a flowchart showing processes executed by the driving circuit.

Next, processes shown in FIG. 10 executed by the setting unit 52 of the lower arm driving circuit DrL will be described. These processes are repeatedly executed at predetermined control periods. Note that in FIG. 10, the same reference numbers are applied to processes as same as the processes shown in FIG. 4

When determining that a fault has not occurred on the surge detecting unit 60 at step S13, the process proceeds to step S18 and performs, based on the voltage deviation ΔVs, the switch current ID, the switch temperature TD, the lower arm OFF voltage VoffL and the map information, a surge feedback control in which resistance Roff of the gate resistor 51 is set when switching the lower arm switch SWL to be OFF state in the next switching period. The voltage deviation ΔVs is calculated based on the lower arm surge voltage VphL detected by the surge detecting unit 60 of the lower arm driving circuit DrL.

On the other hand, when determining that a fault has occurred on the surge detecting unit 60 at step S13, the process proceeds to step S19 and performs, based on the voltage deviation ΔVs, the switch current ID, the switch temperature TD, the upper arm OFF voltage VoffH and the map information, a surge feedback control in which resistance Roff of the gate resistor 51 is set when switching the lower arm switch SWL to be OFF state in the next switching period. The voltage deviation ΔVs used in step S19 is calculated based on the upper arm surge voltage VphH detected by the surge detecting unit 60 of the upper arm driving circuit DrH. The surge voltage VphH is produced when the lower arm switch SWL switches to the OFF state. In the present embodiment, the map information used for the process at step S19 is the same as that used in the process at step S18.

According to the above-described embodiment, ON-OFF driving of the own arm switch can be maintained with the surge detection value in the opposed arm side.

Other Embodiments

The above-described embodiments can be modified in the following manner.

The parameters to be correlated with the resistance Roff in the map information is not limited to all of the switch current ID, the switch temperature TD and the OFF voltage Voff, but a part of these parameters and at least one of these parameters may be used.

The method of changing the switching speed is not limited to a method for changing the resistance of the gate resistor. For example, a method of changing the potential (e.g. potential at negative voltage source) at discharging destination of gate charge in the switch can be used. In this case, the switching speed is set such that the lower the potential of the discharge destination, the higher the switching speed is.

According to the first embodiment, as a feedback control of the surge voltage, instead of using the surge voltage produced when the switch turns to the OFF state, a feedback control using a surge voltage produced when the switch turns to the ON state may be utilized. In this case, for the surge voltage produced when the switch turns to ON state, a surge voltage detected in the opposed arm side may be used.

Switches are not limited to N-channel MOSFETs but may be IGBTs. Further, the power converter provided with switches is not limited to an inverter, but a full-bridge circuit may be used.

The control unit and the method thereof according to the present disclosure may be accomplished by a dedicated computer including a processor and a memory which is programed such as to execute one or more functions embodied by a computer program. Alternatively, the control unit and the method thereof according to the present disclosure may be accomplished by a dedicated computer provided with one or more dedicated hardware circuits (e.g. logic circuits) configuring a processor. Further, the control unit and the method thereof according to the present disclosure may be accomplished by one or more dedicated computers constituted of a combination of a processor with a memory configured to execute one or more functions, and a processor composed of one or more hardware circuits. Also, the computer program may be stored, as instructions to be executed by the computer, in a computer-readable non-transitory tangible recording media.

CONCLUSION

The present disclosure provides a switch driving circuit and a switching drive apparatus capable of significantly suppressing restriction of chances of driving switches even when a fault occurs on the surge detection circuit.

The present disclosure provides a switch driving circuit (DrH, DrL) that drives a switch (SWH, SWL) including: a surge detecting unit (60) that detects a surge voltage caused by switching of a state of the switch; a speed setting unit that sets, based on the surge voltage detected by the surge detecting unit, a switching speed of the switch when the state of the switch is switched; and a fault determination unit that determines whether a fault has occurred on the surge detecting unit. The speed setting unit is configured to change a setting of the switching speed to a fault setting when the fault determination unit determines that a fault has occurred on the surge detecting unit, from a normal setting in a state where the fault determination unit determines that no fault has occurred on the surge detecting unit, while maintaining driving of the switch.

According to the present disclosure, when determining that a fault has occurred on the surge detecting unit, the setting of the switching speed is changed. With this change, driving the switch to be ON and OFF can be maintained so that restriction of chances of driving the switch can be avoided as much as possible.

Here, as a changing method of the switching speed, for example, a configuration can be utilized in which the switching speed is set to be lower than a case where no fault has occurred on the surge detecting unit, when determining that a fault has occurred on the surge detecting unit.

As a changing method of the switching speed, for example, the following configuration can be utilized.

The switch is composed of an upper arm switch and a lower arm switch. The switch driving circuit further includes an upper arm detecting unit that detects a surge voltage caused by switching of a state of the upper arm switch to be an OFF state and a lower arm detecting unit that detects a surge voltage caused by switching of a state of the lower arm switch to be an OFF state. The speed setting unit is configured to set, based on the surge voltage detected by the upper arm detecting unit, the switching speed of the upper arm switch when the state of the upper arm switch is switched to an OFF state, and to set, based on the surge voltage detected by the loser arm detecting unit, the switching speed of the lower arm switch when the state of the lower arm switch is switched to an OFF state.

A switch being switched to an OFF state in the upper arm switch and the lower arm switch is defined as an own arm switch, and a rest of switch in the upper arm switch and the lower arm switch is defined as an opposed arm switch. A detecting unit corresponding to the own arm switch in the upper arm detecting unit and the lower arm detecting unit is defined as an own arm detecting unit and a detecting unit corresponding to the opposed arm switch in the upper arm detecting unit and the lower arm detecting unit is defined as an opposed arm detecting unit. The fault determination unit is configured to determine whether a fault has occurred on the own arm detecting unit; the speed setting unit is configured to set, when determining that a fault has occurred on the own arm detecting unit, the switching speed of the own arm switch when a state of the own arm switch is switched to an OFF state by using the surge voltage caused by switching of a state of the own arm switch to be an OFF state which is detected by the opposed arm detecting unit.

What is claimed is:

1. A switch driving circuit that drives a switch comprising:
   a surge detecting unit that detects a surge voltage caused by switching of a state of the switch;
   a speed setting unit that sets, based on the surge voltage detected by the surge detecting unit, a switching speed of the switch when the state of the switch is switched; and
   a fault determination unit that determines whether a fault has occurred on the surge detecting unit, wherein
the speed setting unit is configured to change a setting of the switching speed to a fault setting when the fault determination unit determines that a fault has occurred on the surge detecting unit, from a normal setting in a state where the fault determination unit determines that no fault has occurred on the surge detecting unit, while maintaining driving of the switch.

2. The switch driving circuit according to claim 1, wherein
the speed setting unit is configured to set the switching speed in the fault setting to be lower than the switching speed in the normal setting, while maintaining the driving of the switch.

3. The switch driving circuit according to claim 2, wherein
the switch driving circuit further comprising a current detecting unit that detects current flowing through the switch;
the speed setting unit is configured to set the switching speed in the normal setting based on the surge voltage detected by the surge detecting unit and the current detected by the current detecting unit; and
the speed setting unit is configured to set the switching speed in the fault setting based on the current detected by the current detecting unit without using the surge voltage detected by the surge detecting unit.

4. The switch driving circuit according to claim 2, wherein
the switch driving circuit further comprising a temperature detecting unit that detects a temperature of the switch;
the speed setting unit is configured to set the switching speed in the normal setting based on the surge voltage detected by the surge detecting unit and the temperature detected by the temperature detecting unit; and
the speed setting unit is configured to set the switching speed in the fault setting based on the temperature detected by the temperature detecting unit without using the surge voltage detected by the surge detecting unit.

5. The switch driving circuit according to claim 1, wherein
the switch is composed of an upper arm switch and a lower arm switch;
the switch driving circuit further comprising an upper arm detecting unit that detects a surge voltage caused by switching of a state of the upper arm switch to be an OFF state and a lower arm detecting unit that detects a surge voltage caused by switching of a state of the lower arm switch to be an OFF state;
the speed setting unit is configured to set, based on the surge voltage detected by the upper arm detecting unit, the switching speed of the upper arm switch when the state of the upper arm switch is switched to an OFF state, and to set, based on the surge voltage detected by the loser arm detecting unit, the switching speed of the lower arm switch when the state of the lower arm switch is switched to an OFF state;
a switch being switched to an OFF state in the upper arm switch and the lower arm switch is defined as an own arm switch, and a rest of switch in the upper arm switch and the lower arm switch is defined as an opposed arm switch;
a detecting unit corresponding to the own arm switch in the upper arm detecting unit and the lower arm detecting unit is defined as an own arm detecting unit and a detecting unit corresponding to the opposed arm switch in the upper arm detecting unit and the lower arm detecting unit is defined as an opposed arm detecting unit;
the fault determination unit is configured to determine whether a fault has occurred on the own arm detecting unit;
the speed setting unit is configured to set, when determining that a fault has occurred on the own arm detecting unit, the switching speed of the own arm switch when a state of the own arm switch is switched to an OFF state by using the surge voltage caused by switching of a state of the own arm switch to be an OFF state which is detected by the opposed arm detecting unit.

6. The switch driving circuit according to claim 1, wherein
the fault determination unit is configured to determine that a fault has occurred on the surge detecting unit when a difference between the switching speed set in a previous switching period of the switch and the switching speed set in a current switching period of the switch exceeds a predetermined threshold.

7. A switch driving apparatus that drives switches composed of an upper arm switch and a lower arm switch, comprising:
a signal generating unit that generates an upper arm drive signal as a drive signal of the upper arm switch, and a lower arm drive signal as drive signal of the lower arm switch; and
a switch driving circuit that drives each switch, including:
a surge detecting unit that detects surge voltage caused by switching a state of the switch,
a speed setting unit that sets, based on the surge voltage detected by the surge detecting unit, a switching speed of the switch when the state of the switch is switched, and
a fault determination unit that determines whether a fault has occurred on the surge detecting unit,
wherein
the speed setting unit is configured to change a setting of the switching speed to a fault setting when the fault determination unit determines that a fault has occurred on the surge detecting unit, from a normal setting where the fault determination unit determines that no fault has occurred on the surge detecting unit, while maintaining driving of the switch,
wherein
the signal generating unit is configured to apply a first dead time between a switching timing in response to an OFF command of one drive signal in the upper arm drive signal and the lower arm drive signal, and a switching timing in response to an ON command of the other drive signal in the upper arm drive signal and the lower arm drive signal during a normal state where the fault determination unit determines that no fault has occurred on the surge detecting unit, and
the signal generating unit is configured to apply a second dead time which is larger than the first dead time between a switching timing in response to an OFF command of one drive signal in the upper arm drive signal and the lower arm drive signal, and a switching timing in response to an ON command of the other drive signal in the upper arm drive signal and the lower arm drive signal during a fault state where the fault determination unit determines that a fault has occurred on the surge detecting unit.

* * * * *